United States Patent
Lin et al.

(12) 
(10) Patent No.: US 6,717,711 B2
(45) Date of Patent: Apr. 6, 2004

(54) STRUCTURE AND METHOD FOR FORMING A HIGH EFFICIENCY ELECTRO-OPTICS DEVICE

(75) Inventors: Ming-Der Lin, Hsinchu (TW); Kwang-Ru Wang, Chiayi (TW); Chang-Da Tsai, Chiayi (TW); Jung-Kuei Hsu, Taipei (TW)

(73) Assignee: Opto Tech Corporation, Hsinchu (TW)

( * ) Notice: Subject to any disclaimer, the term of this patent is extended or adjusted under 35 U.S.C. 154(b) by 62 days.

(21) Appl. No.: 10/071,204

(22) Filed: Feb. 11, 2002

(65) Prior Publication Data

US 2002/0131145 A1 Sep. 19, 2002

(30) Foreign Application Priority Data

Mar. 15, 2001 (TW) .......................... 90106116 A

(51) Int. Cl.[7] .............................. G02F 1/03; G02B 6/12; H01L 21/00; H01L 29/22; H01L 25/00
(52) U.S. Cl. ...................... 359/245; 359/248; 359/254; 385/14; 385/88; 438/14; 438/26; 438/29; 438/106; 438/464; 257/94; 257/704; 250/332
(58) Field of Search ................. 359/245, 246, 359/247, 248, 254; 438/14, 22, 26, 33, 29, 106, 110, 112, 464; 385/1, 2, 3, 14, 88, 131; 257/14, 80, 94, 96, 704; 250/332, 350

(56) References Cited

U.S. PATENT DOCUMENTS

| | | | | |
|---|---|---|---|---|
| 5,574,282 A | * | 11/1996 | Walker et al. | 250/338.3 |
| 5,743,006 A | * | 4/1998 | Beratan | 250/332 |
| 6,025,251 A | * | 2/2000 | Jakowetz et al. | 438/464 |
| 6,465,784 B1 | * | 10/2002 | Kimata | 250/332 |
| 6,562,637 B1 | * | 5/2003 | Akram et al. | 438/14 |
| 6,562,643 B2 | * | 5/2003 | Chen | 438/26 |
| 6,573,121 B2 | * | 6/2003 | Yoneda et al. | 438/106 |

* cited by examiner

Primary Examiner—Loha Ben
(74) Attorney, Agent, or Firm—Sughrue Mion, PLLC

(57) ABSTRACT

A forming method and a structure of a high efficiency electro-optics device are disclosed. In the present invention, the cell-fixing surface between the die carrier and the electro-optics cell is decreased to increase the light emitting and absorbing regions of the electro-optics device. Thus, the operating efficiency and the sensitivity of the electro-optics device is increased substantially. Especially, the present invention has the advantage of fully showing the efficacy of device using the transparent substrate. Furthermore, when the electro-optics cell is fixing on the cell-fixing surface by utilizing the eutectic or metal-melting bonding method, a result of self-alignment can be achieved. Thus, the accuracy of the packaging device is increased substantially, thereby reducing the loss caused by the failure of poor cell-fixing while in mass production and meanwhile increasing the accuracy of fixing cell. Therefore, the present technology is quite suitable for use in the packaging of high precision.

29 Claims, 4 Drawing Sheets

STRUCTURE AND METHOD FOR FORMING A HIGH EFFICIENCY ELECTRO-OPTICS DEVICE

FIELD OF THE INVENTION

The present invention relates to a structure and a method for forming an electro-optics device. More particularly, the present invention relates to a method and a structure for forming a high efficiency electro-optics device.

BACKGROUND OF THE INVENTION

Many kinds of light emitting diodes are widely in use now. According to the packaging method of the light emitting diodes, there are through-hold light emitting diodes, surface-mounted device light emitting diodes, and flip-chip light emitting diodes, etc.

Referring to FIG. 1, it shows that a cross-sectional view of a conventional light-emitting cell fixed on a die carrier. The light-emitting cell includes mainly an epitaxial structure 10 formed on a substrate 20, and the epitaxial structure 10 consists of at least an n-type semiconductor layer, an active layer, and a p-type semiconductor layer. Due to the progress of the process technologies, in order to increase the light emitting intensity of the light emitting diode, instead of the substrate 20 a transparent substrate is utilized after the epitaxial structure 10 is formed. Thus, the emitting light from the light emitting diode is not absorbed by the opaque substrate, and the light-emitting cell becomes a cell that can emit light in forward, backward and sideward directions, so that the light emitting efficiency of the light-emitting cell is increased. In theory, the light emitting and detecting device, which uses the transparent substrate, should be a high efficiency electro-optics device with the features of emitting and detecting light in forward, backward and sideward directions. However, since there is a limitation of the conventional packaging method, and the electrode on the transparent substrate is still formed by the conventional gilding or surfgold method, the efficiency of light emitting and detecting is only increased on the sidewalls of transparent substrate with the used of the transparent substrate. Therefore, the advantage of the device having the transparent substrate cannot be exerted completely.

As shown in FIG. 1, the die carrier 30 of the light-emitting cell is shown. A lead frame, a printed circuit board, or a header is usually used to be a carrier for packaging, and the die carrier 30 is bonded to the substrate 20 of the light-emitting cell to form the first electrode of the light-emitting cell. The cell-fixing surface 40 between the light-emitting cell and the die carrier 30 is fixed on the die carrier 30 by using silver paste, conductive paste, or eutectic bond. Then, a second electrode 50 upon the light-emitting cell is wire bonded to another point of the lead frame 35. Thereafter, a power source is individually connected to the die carrier 30 and the lead frame 35, so that the epitaxial structure 10 of the light-emitting cell emits light.

As shown in FIG. 2, FIG. 2 is a cross-sectional view of a conventional light-emitting cell fixed on a die carrier, wherein the conventional light-emitting cell has a substrate made of insulating material. If the substrate 70 of the light-emitting cell is made of an insulating material, the process is the same as the one described above. The cell-fixing surface 90 between the light-emitting cell and the die carrier 80 is fixed on the die carrier 80 by using silver paste. Then, a first electrode 92 is wire bonded to the lead frame 85 and the second electrode 94 is wire bonded to the die carrier 80, respectively. Finally, a power source is individually connected to the die carrier 80 and the lead frame 85, and then the epitaxial structure 60 of the light-emitting cell emits light.

However, owing to the light-emitting cell bonded directly on the die carrier, the light generated from the light-emitting cell is absorbed by the conventional cell-fixing surface. Therefore, most of the light emitted through the transparent substrate is absorbed by the cell-fixing surface, although the transparent substrate is utilized to replace the opaque substrate. Thus, the light emitting efficiency is decreased, and the advantage, that the light can be emitted in forward and backward directions from the light-emitting cell with the use of the transparent substrate, cannot be fully performed.

SUMMARY OF THE INVENTION

In view of the background of the invention described above, for overcoming the disadvantage, that the light emitting efficiency of the light emitting diode is decreased because the light emitted from the light-emitting cell is absorbed by the cell-fixing surface after the light-emitting cell fixed on the die carrier, the present invention provides a structure and a method for forming an electro-optics device, and more particularly, for forming a high efficiency electro-optics device.

It is the primary object of the present invention to provide a structure and a method for forming a high efficiency electro-optics device. In the present invention, the cell-fixing surface area between the die carrier and the electro-optics cell is decreased, thereby increasing the light emitting and detecting regions of the electro-optics cell. In the meantime, according to the present invention, by using a newly-designed gilding pattern, the light shielding area of the backside of the electro-optics cell is further reduced. Therefore, the light emitting efficiency and the photo detecting sensitivity of the electro-optics device are also increased substantially, so that the electro-optics cell can perform with the maximum efficiency. More particularly, for a device having a transparent substrate, the structure provided by the present invention together with the newly-designed gilding pattern matching with the structure can let the device fully perform, thereby resolving the problem of the low device efficiency.

It is the secondary object of the present invention to provide a structure and a method for forming a high efficiency electro-optics device. With the present invention, a self-aligned bond can be achieved by utilizing the eutectic or the metal-melting method when the electro-optics cell is fixed on the cell-fixing surface. Thus, the accuracy for packaging the device is increased substantially, and the failure therefore is decreased.

In accordance with the aforementioned objects of the present invention, the present invention provides a structure of high efficiency electro-optics device, the structure consisting of: a cell-fixing surface defined on the convex portion of a convex die carrier; an electro-optics cell, located on the cell-fixing surface, the electro-optics cell having a first electrode electrically connected with the convex die carrier and a second electrode electrically connected with another lead frame.

In accordance with the aforementioned objects of this invention, the present invention provides a method for forming a high efficiency electro-optics device, comprising the following steps of: providing a convex die carrier with a convex portion defined as a cell-fixing surface; bonding an electro-optics device cell, which has a first electrode and a second electrode, on the cell-fixing surface; connecting the first electrode electrically with the convex portion of the convex die carrier; and connecting the second electrode electrically with a lead frame.

BRIEF DESCRIPTION OF THE DRAWINGS

A more particular description of the present invention may be given by reference to the embodiments thereof which are illustrated in the appended drawings, wherein.

DETAILED DESCRIPTION OF THE PREFERRED EMBODIMENT

Figure 1:
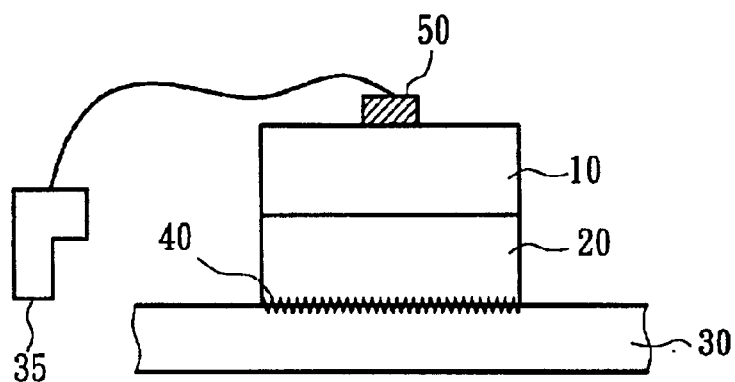
FIG. 1 is a cross-sectional view of a conventional light-emitting cell fixed on a die carrier.
Figure 2:
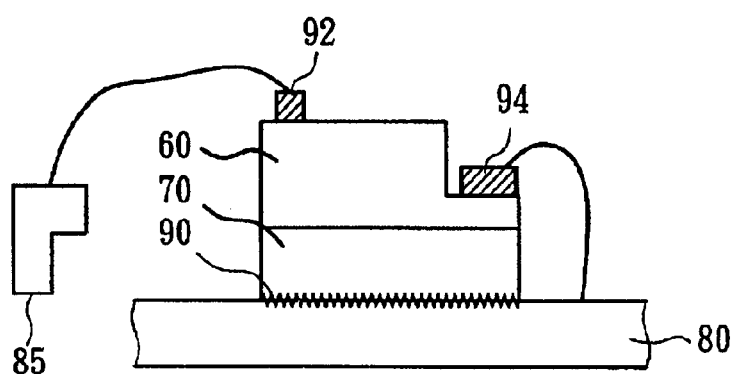
FIG. 2 is a cross-sectional view of a conventional light-emitting cell fixed on a die carrier, wherein the conventional light-emitting cell has a substrate made of insulating material.
Figure 3:
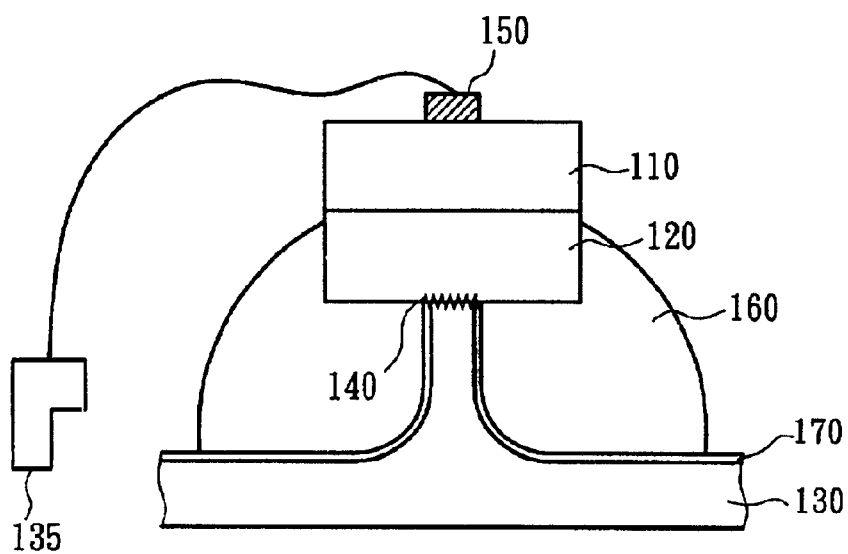
FIG. 3 is a cross-sectional view of the light-emitting cell fixed on the die carrier according to the present invention.

The present invention is disclosed for achieving the advantage of emitting light in forward and backward directions from a light-emitting cell having a transparent substrate. Referring to FIG. 3, FIG. 3 shows a cross-sectional view of the light-emitting cell fixed on the die carrier according to the present invention. The light emitting efficiency is decreased because the light is absorbed by the conventional cell-fixing surface. Therefore, a convex die carrier 130 is designed and fabricated in the present invention, wherein the flat portion on the convex portion is used as a cell-fixing surface 140, and a light reflecting layer 170 with a high reflective coefficient is formed upon the convex portion of the convex die carrier 130. As is understood by persons skilled in the art, the light reflecting layer 170 is formed by the standard semiconductor processes, e.g., film-plated, sputtering, coating, or electroplating, etc. According to the characteristics of the device, the proper materials and processes are selected to form the light reflecting layer 170. For example, different materials have different reflective coefficients for different wavelengths, so that the component is used for detecting or emitting the visible light, the material of high reflective coefficient described in the present invention can be made of the metal layer, such as silver, aluminum, titanium, platinum, Ti—Al alloy, or Si—Al alloy, etc., or the material system consisting of one or more dielectric layers having various refraction indices, such as a single dielectric layer, a dielectric bi-layer or a structure having more than two dielectric layers, wherein those layers are made of titanium nitride, boron nitride, silicon or silicon oxide. Since the techniques for forming a layer of high reflectivity are the fundamental knowledge of this field, it is not further stated herein. Moreover, the technologies, methods and materials for forming the aforementioned layer in the present invention is not limited as well.

Then, with a bonding method using silver paste, melting metals, or eutectic, a transparent substrate 120 of the light-emitting cell is fixed on the cell-fixing surface 140 of the convex die carrier 130. Thus, the first electrode upon the transparent substrate 120 of the light-emitting cell is completely formed.

Figure 4A:
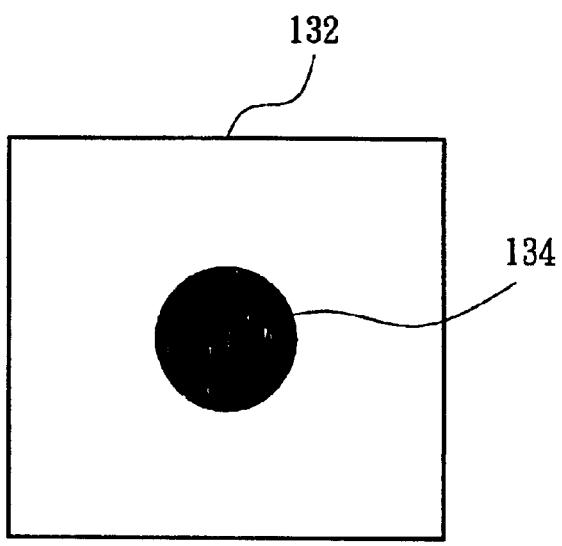
FIGS. 4A and 4B are diagrams showing the contact surface between the cell-fixing surface and the cell during the self-aligned process according to the present invention.
Figure 4B:
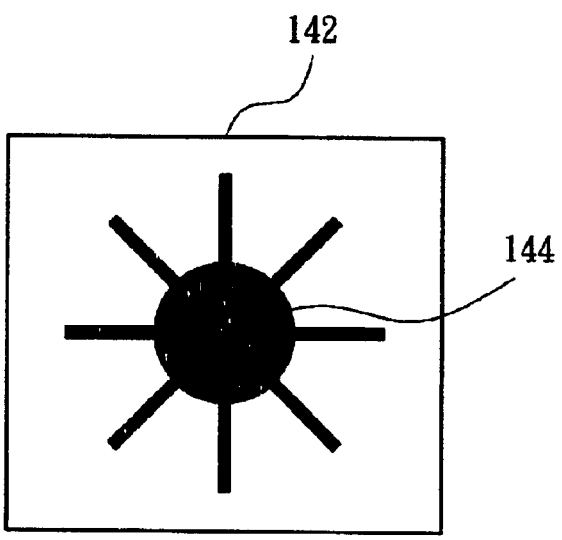

Referring to FIGS. 4A and 4B, FIG. 4A and FIG. 4B are diagrams showing the contact surface between the cell-fixing surface and the cell during the self-alignment process according to the present invention. According to the embodiment of the present invention, the cross sectional area of the cell-fixing surface 140 is smaller than that of the transparent substrate 120 of the light-emitting cell. Meanwhile, with the gilding pattern designed in accordance with the structure of the present invention, (such as shown in FIG. 4A and FIG. 4B), the center region can always be used as the bonding surface for fixing-cell either at the back surface of the cell, the front surface of the die carrier, or the front of the semiconductor base. The top bonding surface and the bottom bonding surface can either have symmetric patterns, for example, both patterns are all from FIG. 4A or FIG. 4B, or asymmetric patterns, for example, one is selected from FIG. 4A and the other one from FIG. 4B, or vice versa. Thus, light shielding area between the back surface of the cell and the die carrier can be minimum, so that the light emitting or light detecting efficiency can reach the maximum. Furthermore, during the fixing-cell process, by utilizing the center region as the pattern for fixing the electrode, the packaged component is located on the center region of the entire device due to the self-alignment effect. Therefore, the packaged device with high accuracy and center-alignment is obtained.

According to the structure and the design pattern described above, the light emitted from the epitaxial structure 110 can go through the regions that are located upon the light transparent substrate 120, and do not contact with the cell-fixing surface 140. Because the light emitted from the light-emitting cell is absorbed by the conventional die carrier, the light reflecting layer 170 with a high reflective coefficient is formed upon the convex portion of the convex die carrier 130 to prevent the emitted light from being absorbed by the convex die carrier 130. Moreover, most of the emitted light disperses to the regions outside the light-emitting cell through the transparent substrate 120, so that the light emitting efficiency of the light emitting diode is enhanced.

After the light-emitting cell is fixed on of the convex die carrier 130, if the cross-sectional area of the cell-fixing surface 140 is very small, the light-emitting cell will be tilted and separated from the cell-fixing surface 140 while the wire-bonding step is performed between the second electrode 150 and another lead frame 135, resulting in the process failures. The present invention further provides a transparent fixing-glue 160 to fix the entire light-emitting cell upon the convex die carrier 130, thereby resolving the problem of the process failure that occurs while the wire-bonding step is performed between the second electrode 150 and another lead frame 135.

Moreover, the present invention further provides a self-aligning bonding method to decrease the contact failure between the light-emitting cell and the convex die carrier 130. The method is described as follows:

Such as shown in FIG. 4A or FIG. 4B, the square contours 132 and 142 stands for the die carriers or the transparent substrates of the light emitting diode, and the patterns in the center position are the contact regions 134 and 144. First, a metal, such as AuSn alloy, PbSn alloy, PbIn alloy, PbSnAg alloy, AuSi alloy, AuGe alloy, AuBe alloy, InSn alloy, AgIn alloy, SnAg alloy, SnAgBi alloy, AuGeNi alloy, or In, etc., is used to form a metal ball or electrode having a ball grid array structure on the contact regions 134 and 144 of transparent substrate 120, such as shown in FIG. 4A or FIG. 4B, and with the same method, the metal ball or electrode made of the same metal material, such as that on contact regions 134 and 144 shown in FIG. 4A or FIG. 4B, is formed upon the cell-fixing surface 140 of the convex die carrier 130.

Then, the step of fixing the light-emitting cell on the cell-fixing surface 140 of the convex die carrier 130 is perfromed. During the fixing step, the temperature has to be raised to the metal melting point to make the metal balls on the transparent substrate 120 and the convex die carrier 130 become liquid. While the liquid metal balls have the mutual contacst with the transparent substrate 120 and with the convex die carrier 130, with the cohesion from the liquid metal balls, an eutectic structure can be formed between the transparent substrate 120 and the convex die carrier 130, thereby achieving a self-aligning cell-fixing process. The aforementioned method not only can complete the electrical connection of the first electrode but also can satisfy the packaging requirement of accurate cell-fixing. The present invention can increase the producing yield substantially, and it is noted that, by utilizing the method of the present invention, the problems of poor yield and lacking of accuracy can be improved especially for the packaging products with high precision, for example, the optical transmitters/receivers, OEIC, and photo couplers, etc. Furthermore, the aforementioned patterns on the contact region are merely stated as the examples for explanation, the present invention is not limited thereto, and any symmetric or asymmetric patterns formed on the transparent substrate of the light emitting diode and the die carrier, and any kind of transformation or modification of the package with an achievable self-aligning method are all within the claimed scope of the present invention.

Figure 5:
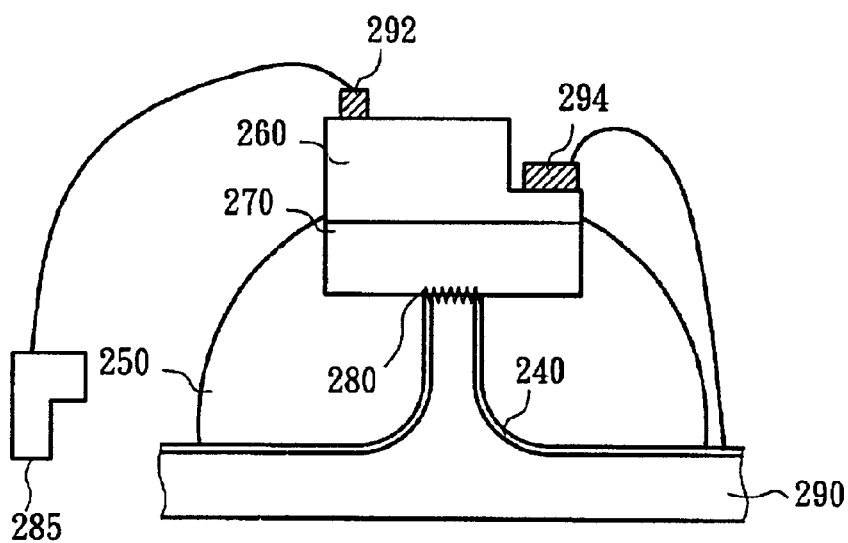
FIG. 5 a cross-sectional view of a light-emitting cell fixed on a die carrier according to the present invention, wherein the light-emitting cell has a substrate made of insulating material.

Referring to FIG. 5, it shows a cross-sectional view of a light-emitting cell fixed on a die carrier according to the present invention, wherein the light-emitting cell has a substrate made of insulating material. Firstly, with the technique of pressing die, a convex die carrier 290 is designed and provided by the present invention, wherein the flat surface of the convex portion is the cell-fixing surface 280, and a light reflecting layer 240 with high reflective coefficient is formed upon the surface of the convex portion of the convex die carrier 290.

Then, by the bonding method utilizing silver paste, conductive paste, or eutectic, the substrate 270 of the light-emitting cell is fixed on the cell-fixing surface 280 of the convex die carrier 290 so as to complete the fixing step.

According to the embodiment of the present invention, the surface area of the cell-fixing surface 280 is smaller than that of the substrate 270 of the light-emitting cell. As shown in the concept described above, the light emitted from the epitaxial structure 260 goes through the regions that are located on the light transparent substrate 270 and do not contact the cell-fixing surface 280. Because the light emitted from the light-emitting cell is absorbed by the conventional die carrier, the light reflecting layer 240 with a high reflective coefficient is formed upon the convex portion of the convex die carrier 290 to prevent the emitting light from being absorbed by the convex die carrier 290, and most of the emitted light disperses to the regions outside the light-emitting cell through the transparent substrate 270, so that the light emitting efficiency of the light emitting diode is enhanced.

After the light-emitting cell has been fixed on of the convex die carrier 290, if the surface area of the cell-fixing surface 280 is very small, the light-emitting cell will be tilted and separated from the cell-fixing surface 280 when the wire-bonding of the first electrode 292 and the second electrode 294, thus causing the process failure. The present invention further provides a transparent fixing-glue 250 to fix the entire light-emitting cell upon the convex die carrier 290. Thus, the problem of the process failure is resolved during the wire-bonding step between the first electrode 292 to another lead frame 285, and that between the second electrode 294 to the convex die carrier 290.

Because the light-emitting cell of the present invention is a light emitting device, the method provided by the present invention is also applied in all the active light emitting devices, such as laser diodes, and in the passive photo detecting devices, such as photo detecting diodes. Naturally, the structures and processes described above is utilized in all the electro-optics devices, for example: PIN photo diodes, avalanche photo diodes, metal-semiconductor-metal photo detectors, metal-oxide-semiconductor field effect transistors, or metal-semiconductor field effect transistors, so that the present invention is not limited to the light-emitting cell. Moreover, the light receiving rate of the photo detecting device is greatly increased by utilizing the packaging structure provided by the present invention. Thus, the electro-optics device of the present invention can be applied to all the through-hold electro-optics devices, the surface-mounted device electro-optics devices, and the flip-chip electro-optics devices.

Figure 6:
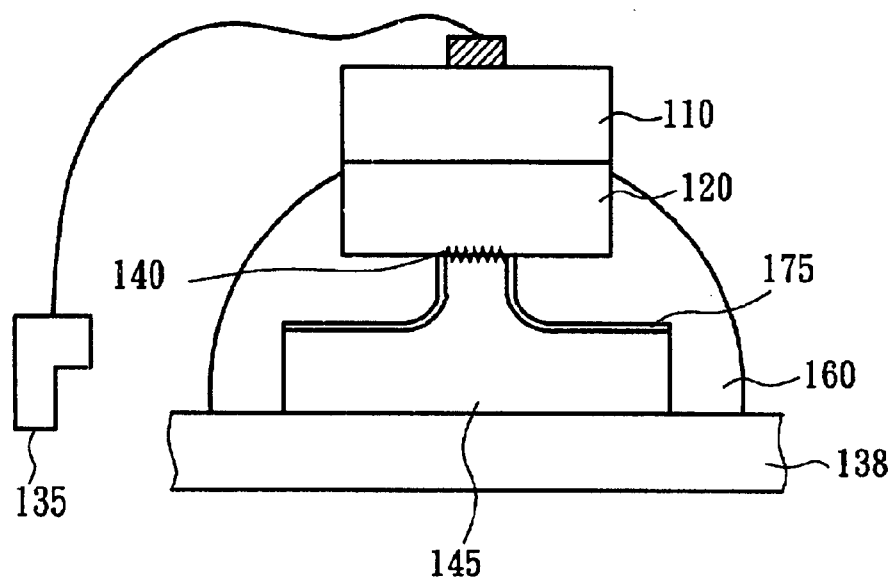
FIG. 6 is a cross-sectional view of another embodiment of a light-emitting cell fixed on the die carrier according to the present invention.
Figure 7:
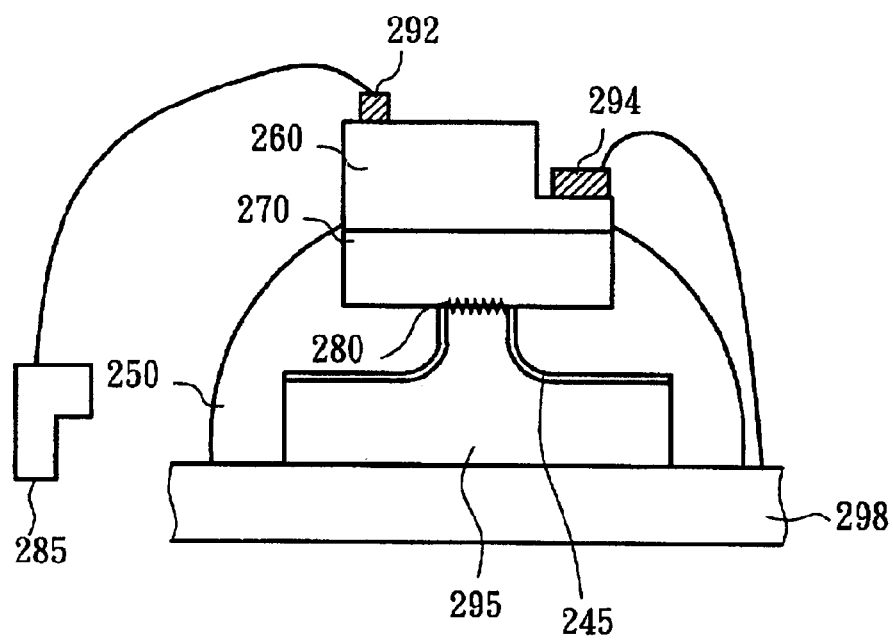
FIG. 7 is a cross-sectional view of another embodiment of a light-emitting cell fixed on a die carrier according to the present invention, wherein the light-emitting cell has a substrate made of insulating material.

Referring to FIG. 6 and FIG. 7, FIG. 6 is a cross-sectional view of another embodiment of a light-emitting cell fixed on the die carrier according to the present invention, and FIG. 7 is a cross-sectional view of another embodiment of a light-emitting cell fixed on a die carrier according to the present invention, wherein the light-emitting cell has a substrate made of insulating material. The differences between the embodiment shown in FIG. 6 and FIG. 7 and the embodiment shown in FIG. 3 and FIG. 5 is that the die carriers consist of a semiconductor base 145 and a semiconductor base 295 located on a base 138 and a base 298, respectively. The convex portions of the cell-fixing surfaces 140 and 280 are formed on the semiconductor bases 145 and 295 after the etching processes are done. Then, the light reflective layers 175 and 245 are formed upon the convex portion of the semiconductor bases 145 and 295. After the light-emitting cell is fixed on the die carrier, the wire-bonding step between the die carrier and the light-emitting cell is performed, and the subsequent processes are all the same as those in the embodiment shown in FIG. 3 and FIG. 5.

In fact, the insulating substrate of the light-emitting cell can also be replaced by a conductive substrate. Moreover, the enhanced light emitting efficiency is also obtained when the electrodes are located on the same side of the light-emitting cell.

Therefore, there is the primary advantage of the present invention to provide a structure and a method for forming a high efficiency electro-optics device. In the present invention, the cell-fixing surface of between the die carrier and the electro-optics cell is decreased thereby increasing the light emitting or absorbing regions of the electro-optics cell. Thus, the efficiency and the sensitivity of the electro-optics device are increased substantially.

There is the second advantage of the present invention to provide a structure and a method for forming a high efficiency electro-optics device. By using the present invention, self-aligning bonding is achieved when the electro-optics cell is fixed on the cell-fixing surface by using the cohesion of the melting metal. Thus, the accuracy of packaging the electro-optics cell is increased substantially, and the failures thereof is decreased.

As is understood by persons skilled in the art, the foregoing are the preferred illustrations of the present invention are illustrations of the present invention rather than limitations of the present invention. Other modifications and similar transformations may be devised without departing from the spirit of the present invention, and the scope thereof is determined by the described claims which follow.

What is claimed is:

1. A structure of electro-optics device with a high efficiency, comprising:
   a plurality of convex die carriers, wherein a convex portion of each of the plurality of convex die carriers is defined as a cell-fixing surface; and
   a plurality of electro-optics cells, and each of the plurality of electro-optics cells has a first electrode and a second electrode, wherein the first electrode is electrically connected with each of the plurality of convex die carriers and the second electrode is electrically connected with a lead frame.

2. The structure of electro-optics device with a high efficiency of claim 1, wherein the structure further comprises a transparent fixing-glue which is used for fixing each of the plurality of convex die carriers and each of the plurality of electro-optics cells.

3. The structure of electro-optics device with a high efficiency of claim 1, wherein the structure comprises a plurality of light reflecting layers located on the surface of each of the plurality of convex die carriers.

4. The structure of electro-optics device with a high efficiency of claim 1, wherein each of the plurality of electro-optics cells is selected from the group consisting of a light-emitting cell, a PIN photo diode cell, an avalanche photo diode cell, a metal-semiconductor-metal photo detector cell, a metal-oxide-semiconductor field effect transistor cell, and a metal-semiconductor field effect transistor cell.

5. The structure of electro-optics device with a high efficiency of claim 1, wherein a silver paste is used for wire bonding between the first electrode and the cell-fixing surface.

6. The structure of electro-optics device with a high efficiency of claim 1, wherein a conductive paste is used for wire bonding between the first electrode and the cell-fixing surface.

7. The structure of electro-optics device with a high efficiency of claim 1, wherein an eutectic method is used for wire bonding between the first electrode and the cell-fixing surface.

8. The structure of electro-optics device with a high efficiency of claim 1, wherein the plurality of convex die carriers further comprises:
   a plurality of bases; and
   a plurality of semiconductor bases, wherein a first surface of each of the plurality of semiconductor bases is located on each of the plurality of bases, and a second surface of each of the plurality of semiconductor bases has a convex portion, and the convex portion is the cell-fixing surface.

9. The structure of electro-optics device with a high efficiency of claim 8, wherein the structure further comprises a light reflecting layer located on the convex second surface of each of the plurality of semiconductor bases.

10. The structure of electro-optics device with a high efficiency of claim 8, wherein a metal material is used for wire bonding between the first electrode and the cell-fixing surface.

11. The structure of electro-optics device with a high efficiency of claim 10, wherein the metal material is selected from the group consisting of AuSn alloy, PbSn alloy, PbIn alloy, PbSnAg alloy, AuSi alloy, AuGe alloy, AuBe alloy, InSn alloy, AgIn alloy, SnAg alloy, SnAgBi alloy, AuGeNi alloy, and In.

12. The structure of electro-optics device with a high efficiency of claim 1, wherein the cell-fixing surface is selected from a symmetric cell-fixing surface having a first pattern and a second pattern, the first pattern and the second pattern being mirror-reflected to each other.

13. The structure of electro-optics device with a high efficiency of claim 1, wherein the cell-fixing surface is selected from an asymmetric cell-fixing surface having a first pattern and a second pattern, the first pattern and the second pattern not being mirror-reflected to each other.

14. A method for forming a high efficiency electro-optics device, comprising:
   providing a plurality of convex die carriers having a convex portion defined as a cell-fixing surface;
   bonding a first electrode of an electro-optics cell on each of the plurality of cell-fixing surfaces to connect electrically with each of the plurality of die carriers; and
   connecting electrically a second electrode of the electro-optics cell with an electrical adapter.

15. The method for forming a high efficiency electro-optics device of claim 14, wherein the steps of providing the convex die carriers further comprise:
   providing a plurality of bases;
   etching a plurality of semiconductor bases to form each of a plurality of convex cell-fixing surfaces on each of a plurality of first surfaces of the plurality of semiconductor bases; and
   fixing each of a plurality of second surfaces of the plurality of semiconductor bases on each of the plurality of bases.

16. The method for forming a high efficiency electro-optics device of claim 15, wherein the method further comprises a step of forming a light reflecting layer located on each of the plurality of first surfaces of the plurality of semiconductor bases.

17. The method for forming a high efficiency electro-optics device of claim 14, wherein the electrical adapter is a lead frame.

18. The method for forming a high efficiency electro-optics device of claim 14, wherein the electrical adapter is a printed circuit board.

19. The method for forming a high efficiency electro-optics device of claim 14, wherein said electrical adapter is a metal base.

20. The method for forming a high efficiency electro-optics device of claim 14, wherein the method further comprises a step of providing a transparent fixing-glue for fixing each of the plurality of convex die carriers and the electro-optics cell.

21. The method for forming a high efficiency electro-optics device of claim 14, wherein the method further comprises a step of forming a light reflecting layer plated on the surface of each of the plurality of convex die carriers.

22. The method for forming a high efficiency electro-optics device of claim 14, wherein the electro-optics cell is selected from the group consisting of a light-emitting cell, a PIN photo diode cell, an avalanche photo diode cell, a metal-semiconductor-metal photo detecting cell, a metal-oxide-semiconductor field effect transistor cell, and a metal-semiconductor field effect transistor cell.

23. The method for forming a high efficiency electro-optics device of claim 14, wherein the method further comprises a step of providing a self-aligning process for fixing the first electrode and each of the plurality of cell-fixing surfaces, and the self-aligning process comprising:

forming a metal material on the first electrode;

forming a metal layer on each of the plurality of cell-fixing surfaces; and under a specific temperature, contacting the metal layer and the metal material to form a metal bonding for accomplishing an electrical connection between the first electrode and the plurality of die carriers.

24. The method for forming a high efficiency electro-optics device of claim 23, wherein the metal bonding is an eutectic bonding.

25. The method for forming a high efficiency electro-optics device of claim 23, wherein the metal bonding is a metal melting.

26. The method for forming a high efficiency electro-optics device of claim 23, wherein the metal material is selected from the group consisting of an AuSn alloy, PbSn alloy, PbIn alloy, PbSnAg alloy, AuSi alloy, AuGe alloy, AuBe alloy, InSn alloy, AgIn alloy, SnAg alloy, SnAgBi alloy, AuGeNi alloy, and In.

27. The method for forming a high efficiency electro-optics device of claim 23, wherein the specific temperature is higher than the melting temperature of the metal material.

28. The method for forming a high efficiency electro-optics device of claim 14, wherein each of the plurality of cell-fixing surfaces is selected from a symmetric cell-fixing surface having a first pattern and a second pattern, the first pattern and the second pattern being mirror-reflected to each other.

29. The method for forming a high efficiency electro-optics device of claim 14, wherein each of the plurality of cell-fixing surfaces is selected from an asymmetric cell-fixing surface having a first pattern and a second pattern, the first pattern and the second pattern not being mirror-reflected to each other.

* * * * *